United States Patent [19]

Bauer

[11] Patent Number: 5,105,244
[45] Date of Patent: Apr. 14, 1992

[54] GATE TURN-OFF POWER SEMICONDUCTOR COMPONENT

[75] Inventor: Friedhelm Bauer, Würenlingen, Switzerland

[73] Assignee: Asea Brown Boveri Ltd., Baden, Switzerland

[21] Appl. No.: 713,019

[22] Filed: Jun. 11, 1991

Related U.S. Application Data

[63] Continuation of Ser. No. 552,111, Jul. 13, 1990, abandoned.

[30] Foreign Application Priority Data

Jul. 19, 1989 [CH] Switzerland .............. 2693/89

[51] Int. Cl.$^5$ .............................................. H01L 29/10
[52] U.S. Cl. ....................................... 357/23.4; 357/38; 357/39; 357/40; 357/43
[58] Field of Search .................. 357/23.4, 38, 39, 43, 357/40

[56] References Cited

U.S. PATENT DOCUMENTS

| | | |
|---|---|---|
| 4,466,176 | 8/1984 | Temple . |
| 4,623,910 | 11/1986 | Risberg .............. 357/38 |
| 4,642,669 | 2/1987 | Roggwiller et al. ............... 357/52 |
| 4,662,957 | 5/1987 | Hagino ................ 357/38 |
| 4,689,647 | 8/1987 | Nakagawa et al. ............ 357/23.4 |
| 4,742,382 | 5/1988 | Jaecklin ................. 357/39 |
| 4,757,025 | 6/1988 | Bender ................. 357/38 |
| 4,779,123 | 10/1988 | Bencuya et al. .............. 357/23.4 |
| 4,782,379 | 11/1988 | Baliga .................. 357/23.4 |
| 4,841,345 | 6/1989 | Majumdar .................. 357/23.4 |
| 4,857,983 | 8/1989 | Baliga et al. .............. 357/23.4 |
| 4,961,099 | 10/1990 | Roggwiller ............. 357/39 |
| 4,982,261 | 1/1991 | Takanashi .................. 357/38 |

FOREIGN PATENT DOCUMENTS

| | | |
|---|---|---|
| 0133642 | 3/1985 | European Pat. Off. ............ 357/23.4 |
| 340445 | 11/1989 | European Pat. Off. . |
| 3542570 | 6/1987 | Fed. Rep. of Germany . |
| 2088631 | 6/1982 | United Kingdom . |

OTHER PUBLICATIONS

Patent Abstracts of Japan, vol. 12, No. 498, Dec. 1988, & JP, A, 63209172, Aug. 30, 1988, pp. 343-348.

Revue de Physics Appliquee, vol. 20, No. 8, Aug. 1985, Paris, France, H. Tranduc et al.: "Le Transistor-Thyristor Metal-Oxide-Semiconductor (T$^2$ MOS)", pp. 575-581.

IEEE Transactions on Electron Deivces, vol. ED-33, No. 10, Oct. 1986, New York, U.S., V.A.K. Temple: "MOS-Controlled Thyristors-A New Class of Power Devices", pp. 1609-1618.

*Primary Examiner*—Edward J. Wojciechowicz
*Attorney, Agent, or Firm*—Oblon, Spivak, McClelland, Maier & Neustadt

[57] ABSTRACT

In a MOS-controlled thyristor MCT, the second base layer (16) is pulled to the cathode-side surface of the semiconductor substrate (1) between the MCT until cells. At this point, a collector zone (20), which is doped oppositely to the second base layer (16) is arranged which is connected to the cathode contact (2) and reaches into the second base layer (16). Together with the second base layer (16) and an additional opposite anode short circuit, the collector zone (20) forms an inverse diode structure (11) which saves an external free-wheeling diode when inductive loads are switched.

6 Claims, 3 Drawing Sheets

GATE TURN-OFF POWER SEMICONDUCTOR COMPONENT

This application is a continuation of application Ser. No. 07/522,111, filed on Jul. 13, 1990, now abandoned.

BACKGROUND OF THE INVENTION

1. Field of the Invention

The present invention relates to the field of power electronics. In particular, it relates to a gate turn-off power semiconductor component, comprising (a) in a semiconductor substrate between an anode and a cathode a plurality of unit cells which are arranged next to one another and connected in parallel;

(b) in each of the unit cells, a thyristor structure with a sequence of alternatingly doped layers which comprises an emitter zone connected to a cathode contact, a first base layer, a second base layer which is common to all unit cells and an emitter layer connected to an anode contact; and (c) for each emitter zone a field-effect controlled short-circuit which, together with the thyristor structure, forms an MOS-controlled thyristor MCT.

Such a component is known, for example, from the article by V. A. K. Temple, IEEE Trans. Electron Devices, Vol. ED-33, pp. 1609-1618 (1986).

2. Discussion of Background

For some years, the development of MOS-controlled components has been increasingly driven forward in power electronics. This trend was started by the unipolar power MOSFETs with DMOS structure (FIG. 1).

The main advantage of these MOS-controlled components is based on the high input impedance at the gate electrode. It enables the component to be driven with a comparatively very low power expenditure.

However, the DMOSFETs have an important disadvantage: because of the unipolar nature of conduction in these components, high breakdown voltages must be obtained at the cost of high forward resistances which limit the maximum current intensity.

To solve this problem, MOS-controlled bipolar structures have been proposed which combine the advantages of low-power MOS drive with the advantages of low-resistance bipolar current transfer.

One of these structures is known from the prior art as IGBT (Insulated Gate Bipolar Transistor).

Another structure which has been described in the article by V. A. K. Temple initially mentioned is the so-called MOS-controlled thyristor MCT (MOS Controlled Thyristor). Such an MCT, which consists of a plurality of adjacently located parallel-connected unit cells, is turned off by short circuiting the cathode-side emitter zones by means of an integrated MOSFET (FIG. 2).

Although the currently known bipolar MCTs are superior to the unipolar DMOSFETs in most fields for the abovementioned reasons, they still have the following disadvantage:

Every conventional DMOSFET has a parasitic diode structure 11 (drawn in FIG. 1) which is polarized in the reverse direction during normal operation (positive voltage at anode A).

It is generally known that in the case of inductive loads, the actual switch must be protected against the energy stored in the inductance during the switching process. In the conventional art, this is ensured by so-called antiparallel free-wheeling diodes within the circuit. Naturally, these additional components make a convertor, for example, more complicated and more expensive.

A new generation of power MOSFETs has recently become available in which the structure-inherent inverse diode described has been improved technologically to such an extent that it can also fully handle large inductive reverse currents. Discrete protective diodes can therefore largely be omitted in these modern MOSFETs.

However, this is not the case in the known MCTs.

SUMMARY OF THE INVENTION

Accordingly, one object of this invention is to provide a novel MCT which also has an integrated inverse diode and thus provides the possibility of considerably simplified circuits.

In a component of the type initially mentioned, this object is achieved by the fact that (c) the second base layer comes to the cathode-side surface of the semiconductor substrate between the unit cells, where a collector zone doped oppositely to the second base layer and reaching into the second base layer is arranged and is connected to the cathode contact; and (d) the emitter layer is interrupted on the side opposite to the collector zone by an oppositely doped zone which is connected to the anode contact and, together with the second base layer and the collector zone, forms a diode structure.

Thus, the core of the invention consists of creating the desired inverse diode structure between the unit cells by inserting additional doped zones.

According to a first illustrative embodiment of the invention, a separate anode short-circuit zone is used as oppositely doped zone which interrupts the emitter layer.

According to a second illustrative embodiment of the invention, a part of a continuous stop layer which is arranged between the emitter layer and the second base layer is used as oppositely doped zone which interrupts the emitter layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
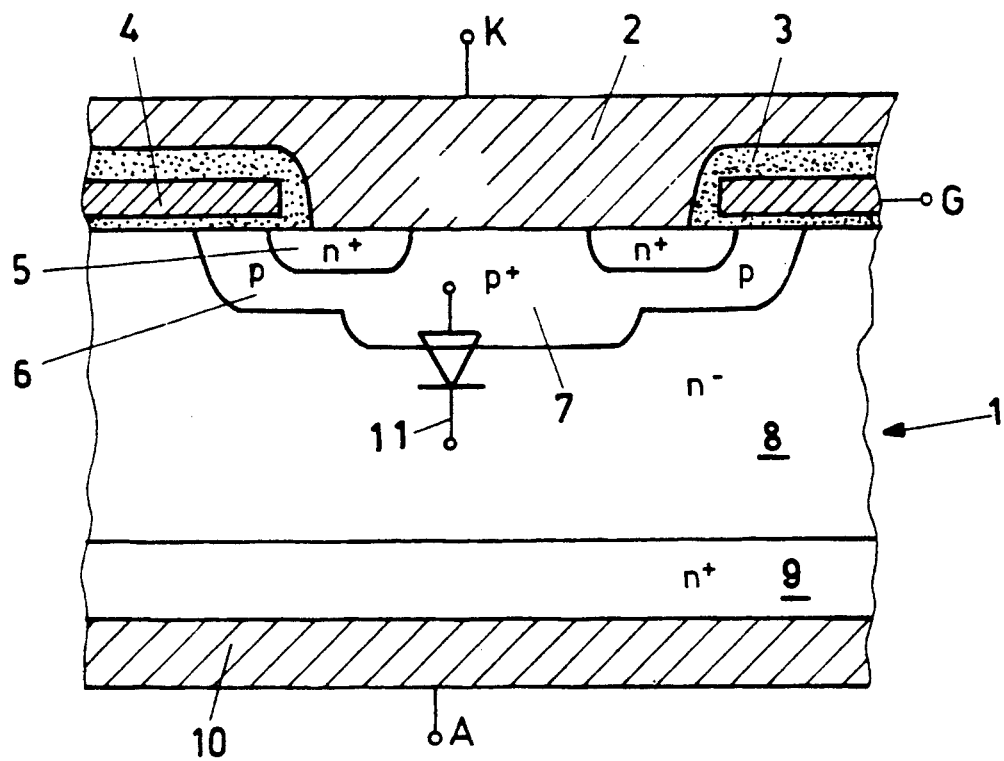
FIG. 1 shows the unit cell of a DMOSFET according to the prior art, having the inherent inverse diode structure.

Referring now to the drawings, wherein like reference numerals designate identical or corresponding parts throughout the several views, FIG. 1 shows the unit cell of a DMOSFET which is known, for example, from U.S. Pat. No. 4,466,176.

In a semiconductor substrate 1, a sequence of differently doped layers, which comprises a $p^+$-doped contact zone 7, an n -doped base layer 8 and an $n^+$-doped emitter layer 9, is arranged between a cathode K and an anode A having the corresponding cathode contact 2 and anode contact 10.

The side of the contact zone 7 is provided with an MOS control structure which consists of an $n^+$-doped source zone 5, a p-doped channel zone 6 and a gate electrode 4. Separated from the cathode contact 2 and semiconductor substrate 1 by a gate insulation 3, the gate electrode 4 is arranged above the channel zone 6.

As indicated by the circuit symbol in FIG. 1, the contact zone 7, the base layer 8 and the emitter layer 9 form a diode structure 11 which is connected in antiparallel with the actual DMOSFET and imparts the desired properties to the component during the switching of inductive loads.

Figure 2:
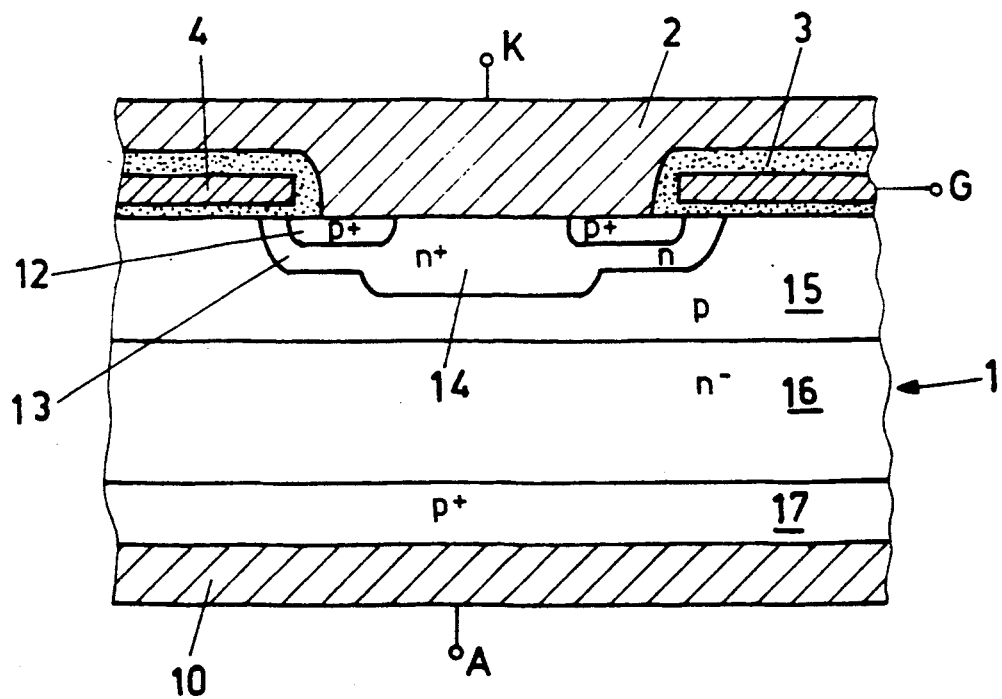
FIG. 2 shows the unit cell of an MCT of the prior art.

The conventional MCT, the unit cell of which is reproduced in FIG. 2, does not contain any such diode structure. Instead, it contains a four-layer alternatingly doped thyristor structure which consists of an emitter zone 14, a first base layer 15, a second base layer 16 and an emitter layer 17 (the doping sequence in the component of FIG. 2 is, for example: $n^+$, p, $n^-$, $p^+$).

Figure 3:
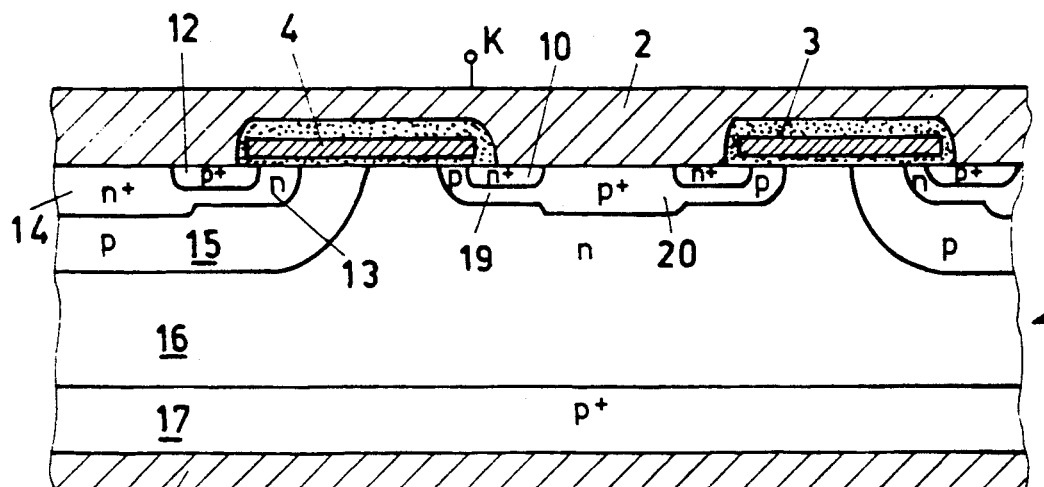
FIG. 3 shows the unit cell of an MCT having an additional IGBT structure for the turn-on in accordance with a prior application.

The missing diode structure can now be integrated into the MCT in the following manner:

So that it is also possible to turn on a component according to FIG. 2 via the same gate electrode 4 by means of a pulse of inverse polarity, it has been proposed in a prior European Patent Application (Application No. 89105333.2) to pull the second base layer 17 up to the surface of the semiconductor substrate 1 on the cathode side between the MOS structures and to arrange IGBT cells there (FIG. 3).

In this arrangement, each IGBT cell contains a collector zone 20 (here $p^+$-doped) which is directly connected to the cathode contact 2 and is provided with a MOS structure consisting of a source zone 18 (here $n^+$-doped), a channel zone 19 (here p-doped) and the gate electrode 4. Furthermore, the second base layer 16 and the emitter layer 17 belongs to each IGBT cell.

As is shown by the comparison between FIG. 3 and FIG. 1, a considerable proportion of the DMOSFET structure is already integrated into the MCT by means of such an IGBT cell. To obtain then the desired integrated antiparallel diode structure 11, conventional anode short circuits are additionally provided on the anode side in accordance with a first preferred illustrative embodiment (FIG. 4).

Each of these anode short circuits essentially consists of a separated anode short-circuit zone 21 which is ($n^+$-)doped oppositely to the emitter layer 17 and is arranged opposite to the collector zone 20 and which interrupts the emitter layer 17 and thus connects the second base layer 16 to the anode contact 10. Such anode short circuits are already used in GTO thyristors.

They considerably improve the dynamic characteristic of the component.

Figure 4:
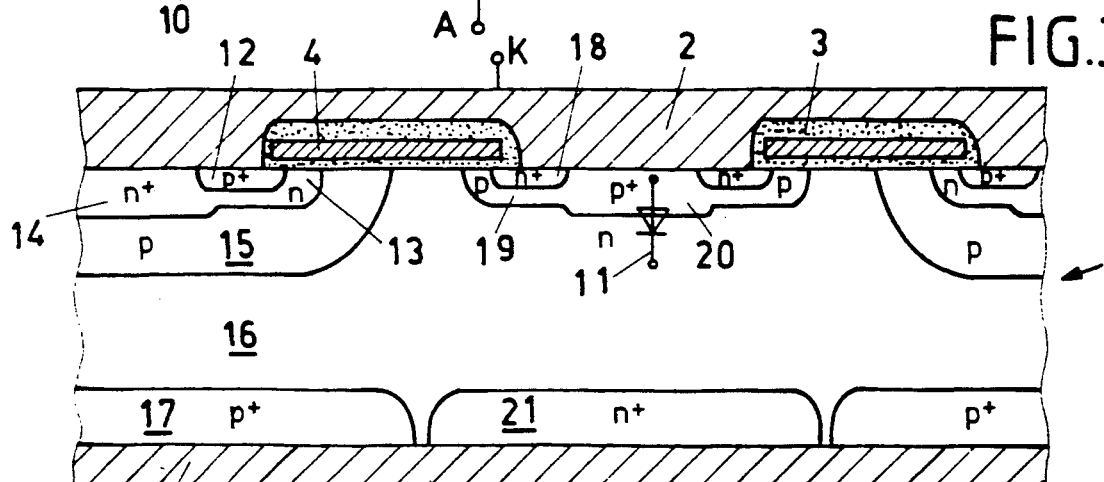
FIG. 4 shows an MCT structure, which is modified on the anode side compared with FIG. 3, with inverse diode according to a first illustrative embodiment of the invention.

The structure of the part of the component of FIG. 4 which consists of the cathode-side IGBT turn-on cell and the opposite anode short circuit then exactly corresponds to the DMOSFET of FIG. 1 and therefore also contains the antiparallel diode structure 11 as indicated by the circuit symbol in FIG. 4.

With a suitable geometric design, this novel MCT can thus also handle conductive reverse currents and thus by saving the external free-wheeling diode) lead to a simplification of circuits which has hitherto only been possible in the case of DMOSFETs.

Figure 5:
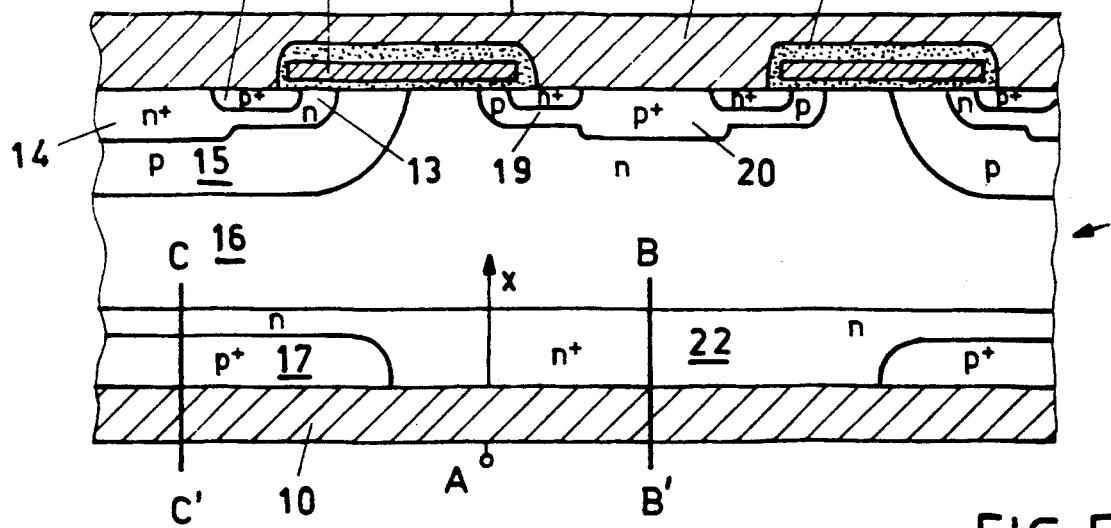
FIG. 5 shows an MCT structure, which is modified on the anode side compared with FIG. 3, with inverse diode according to a second illustrative embodiment of the invention.
Figure 6A:
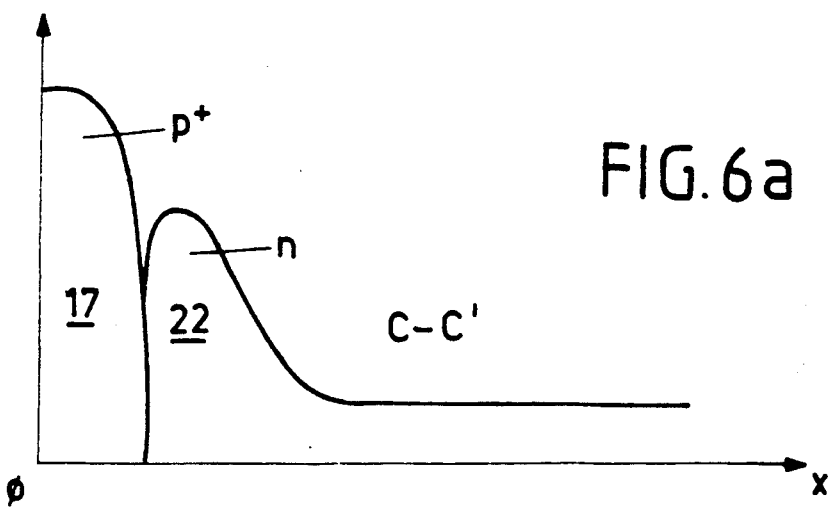
FIGS. 6 a,b show the variation of the doping concentration along lines B—B, and C—C' in the component of FIG. 5.
Figure 6B:
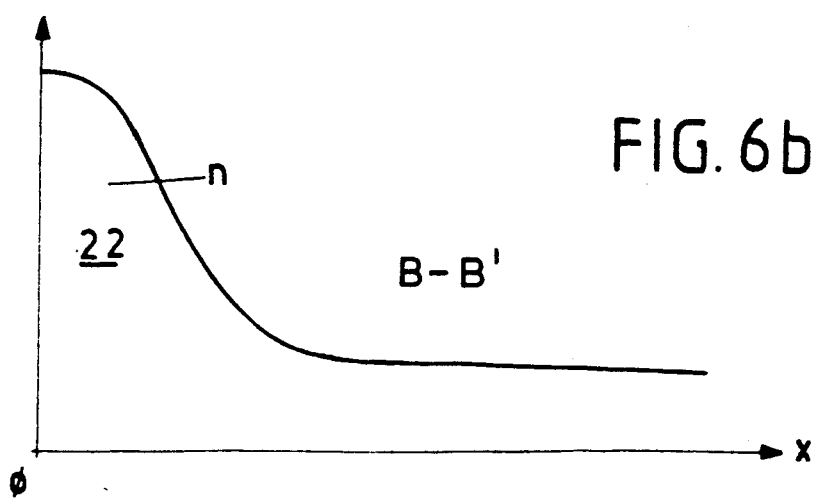

FIG. 5 shows a second preferred illustrative embodiment of the information: the anode short circuit is here designed in such a manner that a total-area stop layer 22, which is arranged between the emitter layer 17 and the second base layer 16, breaks through the emitter layer 17 opposite to the collector zone 20 and thus connects the second base layer 16 to the anode contact 10. The emitter layer 17 then forms zones embedded in the stop layer 22 in the form of islands. The associated dopant profiles with respect to the position coordinate x, drawn in along lines C—C' and B—B', are shown in FIGS. 6a and b.

Figure 7:
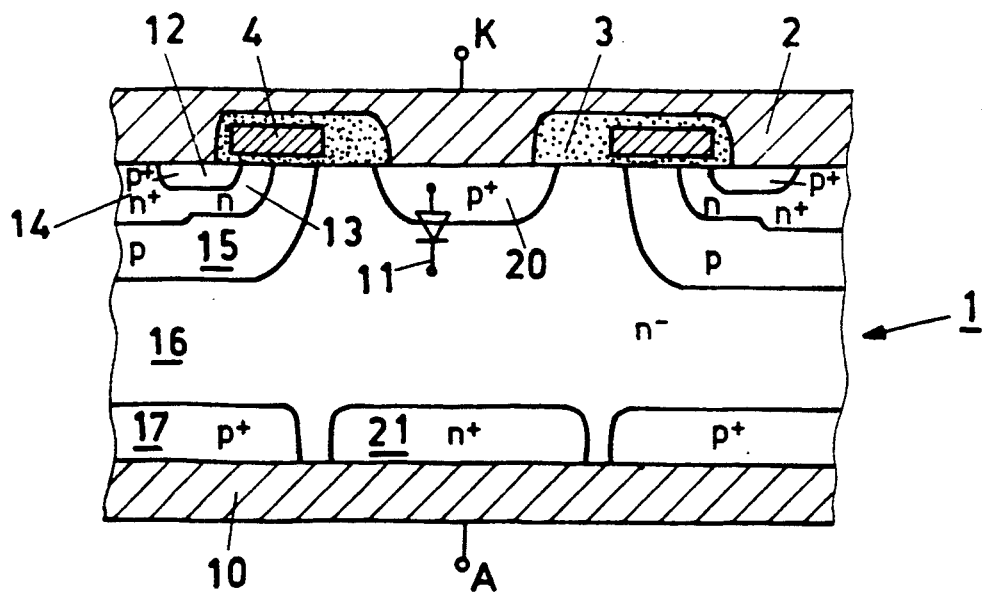
FIG. 7 shows a further illustrative embodiment of an MCT according to the invention without IGBT structure.

Another illustrative embodiment of an MCT with integrated inverse diode according to the invention is shown in FIG. 7. Instead of the IGBT cell as drawn in FIGS. 3 to 5, only the collector zone 20 itself is used here (without the additional MOS structure). The integrated diode structure becomes even more distinct in this case.

This component is turned on by means of a positive gate signal: n channels form at the surfaces of the p-doped first base layer 15 so that electrons can flow via these channels from the emitter zones 14 into the second base layer 16 and from there to the anode-side emitter layer 17.

In the example of FIG. 7, a single anode short-circuit zone 21 is used for implementing the diode structure 11 (according to FIG. 4). However, a continuous stop layer can also be used just as well on the anode side as is shown in FIG. 5 for the MCT with IGBT cell.

It is also conceivable to use instead of the dopings shown in the figures, the corresponding inverse dopings (p instead of n, $p^+$ instead of $n^+$ and conversely).

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An MOS-controlled thyristor MCT, comprising:
   a semiconductor substrate with an upper surface and a lower surface;
   an emitter layer of a first conductivity type, said emitter layer extending from said lower surface of said semiconductor substrate into said semiconductor substrate and having an upper surface;
   a base layer of a second conductivity type, said base layer being formed on said upper surface of said emitter layer and extending to said upper surface of said semiconductor substrate;
   a plurality of island-like base regions of said first conductivity type, said base regions extending from said upper surface of said semiconductor substrate into, and being surrounded by, said base layer;

within each of said base regions an emitter region of said second conductivity type, said emitter region extending from said upper surface of said semiconductor substrate into, and being surrounded by, said base region;

within each of said emitter regions a plurality of island-like first source regions of said first conductivity type, said first source regions extending from said upper surface of said semiconductor substrate into, and being surrounded by, said emitter region;

an isolated gate electrode formed on said upper surface of said semiconductor substrate and covering at least an upper surface of said base regions and an upper surface of said emitter regions;

between said base regions a collector region of said first conductivity type, said collector region extending from said upper surface of said semiconductor substrate into, and being surrounded by, said base layer;

a doped region of said second conductivity type formed in said lower surface of said substrate and extending from said lower surface of said semiconductor substrate to said base layer, said doped region formed only opposite said collector region to produce in said substrate a diode, which includes said collector region and said doped region;

a cathode contact formed on said upper surface of said semiconductor substrate in contact with said emitter regions, said first source regions, and said collector region; and an anode contact formed on said lower surface of said semiconductor substrate in contact with said emitter layer and said region of said second conductivity type opposite to said collector region.

2. A thyristor as claimed in claim 1, wherein said doped region of said second conductivity type opposite to said collector region is an island-like region.

3. A thyristor as claimed in claim 1, wherein said region of said second conductivity type opposite to said collector region is part of a stopping layer which separates said emitter layer from said base layer.

4. A thyristor as claimed in one of claims 1 to 3, further comprising:

within each of said collector regions a plurality of island-like second source regions of said second conductivity, said second source regions extending from said upper surface of said semiconductor substrate into, and being surrounded by, said collector region;

said gate electrode covering at least an upper surface of said collector regions; and said cathode contact formed in contact with said second source regions.

5. A thyristor as claimed in one of claims 1 to 3, wherein:

said emitter region is $n^+$-doped, said base region is p-doped, said base layer is $n^-$-doped, said emitter layer is $p^+$-doped, said collector region is $p^+$-doped and said doped region of said second conductivity type opposite to said collector region is $n^+$-doped.

6. A thyristor as claimed in claim 4, wherein:

said emitter region is $n^+$-doped, said base region is p-doped, said base layer is $n^-$-doped, said emitter layer is $p^+$-doped, said collector region is $p^+$-doped and said doped region of said second conductivity type opposite to said collector region is $n^+$-doped.

* * * * *